(12) United States Patent
Nakayama et al.

(10) Patent No.: US 10,084,078 B2
(45) Date of Patent: Sep. 25, 2018

(54) SEMICONDUCTOR DEVICE AND METHOD OF MANUFACTURING SAME

(71) Applicant: Renesas Electronics Corporation, Tokyo (JP)

(72) Inventors: Tomoo Nakayama, Hitachinaka (JP); Hiroshi Kawaguchi, Hitachinaka (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/361,303

(22) Filed: Nov. 25, 2016

(65) Prior Publication Data

US 2017/0170306 A1  Jun. 15, 2017

(30) Foreign Application Priority Data

Dec. 9, 2015 (JP) .................. 2015-240421

(51) Int. Cl.
| | |
|---|---|
| *H01L 29/15* | (2006.01) |
| *H01L 29/778* | (2006.01) |
| *H01L 29/423* | (2006.01) |
| *H01L 29/66* | (2006.01) |
| *H01L 29/205* | (2006.01) |
| *H01L 29/20* | (2006.01) |

(52) U.S. Cl.
CPC ...... *H01L 29/7788* (2013.01); *H01L 29/2003* (2013.01); *H01L 29/205* (2013.01); *H01L 29/4236* (2013.01); *H01L 29/66431* (2013.01)

(58) Field of Classification Search
CPC ......... H01L 29/66462; H01L 29/66477; H01L 29/7782–29/7788; H01L 29/7802; H01L 29/66431; H01L 29/4236; H01L 21/28044; H01L 21/28052
See application file for complete search history.

(56) References Cited

U.S. PATENT DOCUMENTS

| | | | | |
|---|---|---|---|---|
| 6,271,573 | B1* | 8/2001 | Suguro | ............ H01L 21/28079 257/301 |
| 7,432,531 | B2 | 10/2008 | Ishida | |
| 9,224,675 | B1* | 12/2015 | Dehaven | ............... H01L 23/481 |
| 2003/0183901 | A1* | 10/2003 | Kanda | ................. H01L 21/2807 257/510 |
| 2008/0315256 | A1* | 12/2008 | Ohta | ...................... B82Y 10/00 257/194 |
| 2014/0070301 | A1* | 3/2014 | Sonoda | ............. H01L 27/11529 257/324 |
| 2016/0225857 | A1* | 8/2016 | Saito | .................... H01L 29/513 |

FOREIGN PATENT DOCUMENTS

JP   2006-245564 A   9/2006

* cited by examiner

*Primary Examiner* — Syed Gheyas
(74) *Attorney, Agent, or Firm* — McGinn IP Law Group, PLLC

(57) ABSTRACT

In a semiconductor device using a nitride semiconductor, a MISFET is prevented from having deteriorated controllability which will otherwise occur when a tungsten film, which configures a gate electrode of the MISFET, has a tensile stress. A gate electrode of a MISFET having an AlGN/GaN heterojunction is formed from a tungsten film having grains with a relatively small grain size and having no tensile stress. The grain size of the grains of the tungsten film is smaller than that of the grains of a barrier metal film configuring the gate electrode and formed below the tungsten film.

6 Claims, 10 Drawing Sheets

SEMICONDUCTOR DEVICE AND METHOD OF MANUFACTURING SAME

CROSS-REFERENCE TO RELATED APPLICATIONS

The disclosure of Japanese Patent Application No. 2015-240421 filed on Dec. 9, 2015 including the specification, drawings, and abstract is incorporated herein by reference in its entirety.

BACKGROUND

The present invention relates to a semiconductor device and a method of manufacturing same, which are suited for use, for example, in a semiconductor device using a nitride semiconductor.

Semiconductor devices using a compound of Group III-V having a band gap larger than that of silicon (Si) have recently attracted attentions. Among them, MISFETs (metal insulator semiconductor field effect transistors) using gallium nitride (GaN) are advantageous from the standpoint of large dielectric breakdown field, high electron saturation velocity, high thermal conductivity, ability of forming a good heterojunction between AlGaN and GaN, and use of a nontoxic and therefore highly-safe material.

For example, Patent Document 1 (Japanese Unexamined Patent Application Publication No. 2006-245564) describes that by making the long direction of a channel of a FET having an AlGaN/GaN heterojunction parallel to the C-axis direction of a hexagonal crystal, generation of piezo charges in a channel region which will otherwise occur due to formation of a gate electrode can be suppressed.

Patent Documents

[Patent Document 1] Japanese Unexamined Patent Application Publication No. 2006-245564

SUMMARY

When tungsten (W) is used as a material of a gate electrode of a FET having an AlGaN/GaN heterojunction in order to reduce the resistance of the gate electrode, piezoelectric polarization charges are generated due to the tensile stress of a tungsten film and make control of the FET difficult.

Another problem and novel features will be apparent from the description herein and accompanying drawings.

Of the embodiments disclosed by the present application, typical ones will be outlined below briefly.

In an embodiment of the invention, there is provided a semiconductor device having a MISFET including a nitride semiconductor in which a tungsten film configuring a gate electrode has grains with a grain size less than that of a barrier metal film configuring the gate electrode but formed below the tungsten film.

In the other embodiment of the invention, there is also provided a method of manufacturing a semiconductor device having a MISFET including a nitride semiconductor, which method includes forming a tungsten film configuring a gate electrode by sputtering under a DC power condition not more than 300 W.

The semiconductor device disclosed in the present application and shown in the following typical embodiment can have improved performance. In particular, a MISFET that has good ON/OFF controllability and can be operated at high speeds can be obtained.

The method of manufacturing a semiconductor device disclosed in the present application and shown in the following typical embodiment can provide a semiconductor device with good performance. In particular, it can provide a MISFET that has good ON/OFF controllability and can be operated at high speeds.

DETAILED DESCRIPTION

Figure 1:
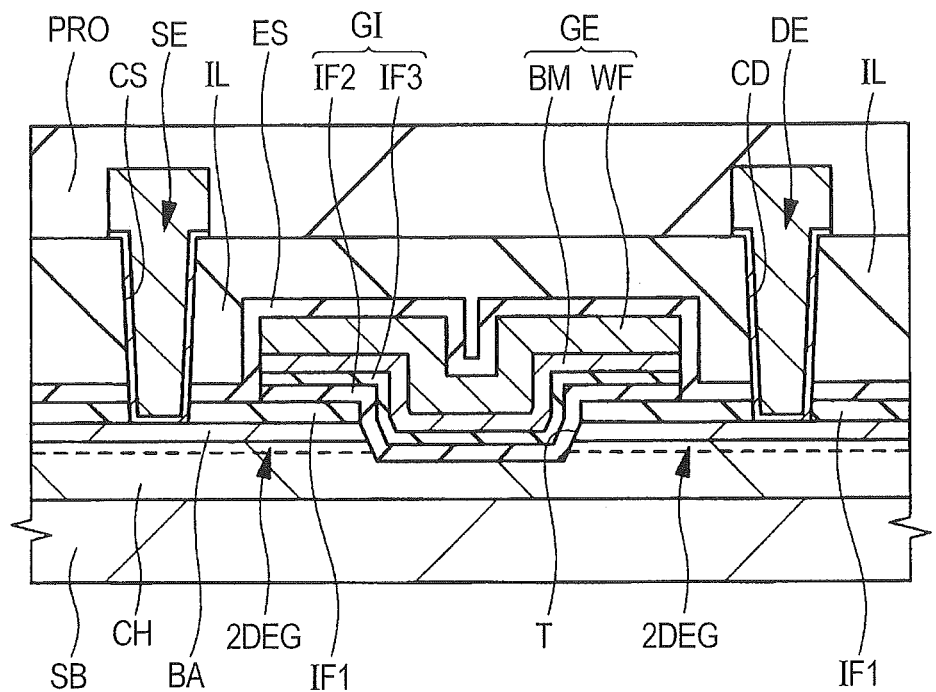
FIG. 1 is a cross-sectional view showing a semiconductor device according to First Embodiment of the invention.

Embodiments of the invention will hereinafter be described in detail based on some drawings. In all the drawings for describing the embodiments, members having the same function will be identified by the same reference numerals and overlapping descriptions will be omitted. In the following embodiments, a description on the same or similar portion is not repeated in principle unless otherwise particularly necessary.

First Embodiment

The semiconductor device of the present embodiment will hereinafter be described in detail referring to some drawings.
[Description of Structure]
FIG. 1 is a cross-sectional view showing the constitution of the semiconductor device of the present embodiment.

The semiconductor device of the present embodiment is a MIS (metal insulator semiconductor) type field effect transistor (FET) using a nitride semiconductor. This semiconductor device is also called "high electron mobility transistor (HEMT)" or "power transistor". The semiconductor device of the present embodiment is a so-called recess-gate type semiconductor device.

In the semiconductor device of the present embodiment, as shown in FIG. 1, a channel layer CH and a barrier layer (buffer layer) BA are stacked one after another on a substrate SB. An active region in which a transistor is to be formed is partitioned by an element isolation region (not shown). The substrate SB is, for example, a semiconductor substrate having a resistivity of 1 Ω·cm and made of silicon (Si) having an exposed (111) plane. The channel layer CH is, for example, a gallium nitride (GaN) layer. The barrier layer BA is, for example, an AlGaN ($Al_xGa_{(1-x)}N$) layer. The AlGaN layer configuring the barrier layer BA has a thickness of, for example, about 0.03 μm. This AlGaN layer has an interstitial distance (C axis) not more than 1.2938 Å. AlGaN and GaN have therebetween a good heterojunction.

The barrier layer BA has thereon an insulating film IF1. This insulating film IF1 serves as an etching stopper when a gate electrode GE is patterned. The insulating film IF1 is made of, for example, a silicon nitride film (a $Si_3N_4$ film, a silicon-nitride-containing film). The insulating film IF1 has, on the upper surface thereof, a trench T penetrating the insulating film IF1 and the barrier layer BA and reaching the middle of the depth of the channel layer CH. The trench T and the insulating film IF1 have, therein and thereon, the gate electrode GE via a gate insulating film GI. The channel layer CH and the barrier layer BA are each made of a nitride semiconductor and the nitride semiconductor of the barrier layer BA has a band gap wider than that of the channel layer CH.

The gate insulating film GI is a stacked film comprised of the insulating film IF1, an insulating film IF2 formed on each of the barrier layer BA and the channel layer CH, and an insulating film IF3 formed on the insulating film IF2. The insulating film IF2 is made of, for example, an alumina ($Al_2O_3$, aluminum oxide) film, while the insulating film IF3 is made of, for example, a hafnium oxide ($HfO_2$) film. In the present embodiment, the gate insulating film GI having a stacked structure as described above will be described, but the gate insulating film GI may be comprised only of the insulating film IF2 or IF3.

The gate electrode GE is a stacked film comprised of a barrier metal film BM, which is a conductive film, formed on the gate insulating film GI and a tungsten (W) film WF, which is a conductive film, formed on the barrier metal film BM. The barrier metal film BM and the tungsten film WF each have a polycrystal structure containing a plurality of crystal grains (grains). A stacked film comprised of the gate electrode GE and the gate insulating film GI lies inside the trench T, right above the trench T, and right above the insulating film IF1 next to the trench T. The tungsten film WF has no tensile stress. This means that the tungsten film WF has a stress of 0 or a compression stress.

The barrier metal film BM serves to prevent tungsten in the tungsten film WF configuring the gate electrode GE from diffusing in the gate insulating film GI and the like. By this, reduction in breakdown voltage due to diffusion of tungsten can be prevented. The barrier metal film BM also serves to enhance adhesion between the tungsten film which is a main conductor of the gate electrode GE and the gate insulating film GI which is an underlying film of the gate electrode GE.

The barrier metal film BM is made of, for example, a titanium nitride (TiN) film. As a material of the barrier metal film BM, not only titanium nitride but also titanium (Ti), tantalum (Ta), or tantalum nitride (TaN) may be used. In other words, as the material of the barrier metal film BM, titanium (Ti) or tantalum (Ta), or a nitride compound thereof may be used.

A two-dimensional electron gas 2DEG is formed in a region which is in the vicinity of the interface between the channel layer CH and the barrier layer BA and on the side of the channel layer CH. When a threshold potential is applied to the gate electrode GE, a channel is formed in the vicinity of the interface between the gate insulating film GI and the channel layer CH.

The two-dimensional electron gas 2DEG is formed by the following mechanism. Respective nitride semiconductors (here, gallium nitride-based semiconductors) configuring the channel layer CH and the barrier layer BA are different in band gap (forbidden band width) and electron affinity. A well potential is therefore formed at the junction surface of these semiconductors. Electrons are accumulated in this well potential and as a result, a two-dimensional electron gas 2DEG is formed in the vicinity of the interface between the channel layer CH and the barrier layer BA.

The two-dimensional electron gas 2DEG formed in the vicinity of the interface between the channel layer CH and the barrier layer BA is separated by the trench T having the gate electrode GE therein. In the semiconductor device of the present embodiment, therefore, an OFF state can be maintained when a threshold potential is not applied to the gate electrode GE, while a channel is formed and an ON state can be maintained when a threshold potential is applied to the gate electrode GE. Therefore, the normally-off operation can be performed.

The stacked film comprised of the gate insulating film GI and the gate electrode GE and the insulating film IF1 have upper surfaces covered with an interlayer insulating film ES and an interlayer insulating film IL formed successively on the stacked film and the insulating film IF1. The interlayer insulating film ES is made of, for example, a silicon nitride film ($Si_3N_4$ film), while the interlayer insulating film IL is made of, for example, a silicon oxide ($SiO_2$ film). The interlayer insulating film IL has a planarized upper surface.

The barrier layers BA on both sides of the gate electrode GE have thereon a source electrode SE and a drain electrode DE, respectively. The gate electrode GE, the source electrode SE, the drain electrode DE, and the channel layer CH configure a MISFET which is a GaN power device. This means that the source electrode SE, the gate electrode GE, and the drain electrode DE are juxtaposed in one direction along the main surface of the semiconductor substrate SB.

The upper surface of the barrier layer BA has an ohmic contact with the source electrode SE via an ohmic layer. The upper surface of the barrier layer BA has an ohmic contact with the drain electrode DE via an ohmic layer. The source electrode SE is comprised of a coupling portion (plug) located in the contact hole CS penetrating the interlayer insulating films ES and IL and a wiring portion on this coupling portion. The drain electrode DE is comprised of a coupling portion (plug) located in the contact hole CD penetrating the interlayer insulating films ES and IL and a wiring portion on this coupling portion. In other words, the interlayer insulating film IL has, above the upper surface thereof, the wiring portion of each of the source electrode SE and the drain electrode DE.

The wiring portion of each of the source electrode SE and the drain electrode DE and the interlayer insulating film IL have an upper surface covered with a protective insulating film PRO. The protective insulating film PRO is a passivation film made of, for example, silicon oxynitride (SiON). The gate electrode GE has electrical coupling with a gate wiring (not shown) via a coupling portion (plug) located in a contact hole (not shown) penetrating the interlayer insulating films ES and IL.

Figure 2:
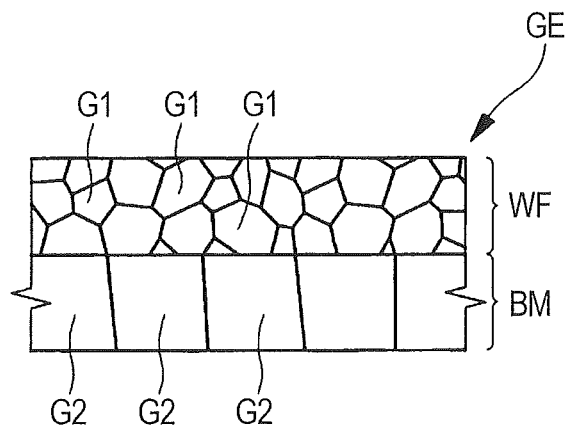
FIG. 2 is a cross-sectional view showing the semiconductor device according to First Embodiment of the invention.

FIG. 2 is a cross-sectional view showing the semiconductor device of the present embodiment and it is a partially enlarged cross-sectional view of the gate electrode GE shown in FIG. 1. FIG. 2 is a cross-sectional view, but to facilitate understanding, hatching is omitted from it.

FIG. 2 shows the cross-section of the stacked structure of the barrier metal film BM and the tungsten film WF configuring the gate electrode GE. The barrier metal film BM includes a plurality of grains G2 made of, for example, titanium nitride, while the tungsten film WF includes a plurality of grains G1 made of tungsten (W).

The grains G2 have a grain size of, for example, 10 nm or more. The grains G1 have, on the other hand, a grain size of 5 nm or less. Thus, the grain size of the grains G1 of the tungsten film WF is less than that of the grains G2 of the barrier metal film BM. The term "grain size" as used herein means, when a predetermined film has a plurality of grains, an average grain size determined by averaging the long diameter and the short diameter of each of the plurality of grains and then averaging the resulting values of the grains.

When the grain size of the grains G1 is 5 nm or less, one grain G1 does not extend from the bottom surface to the top surface of the tungsten film WF because the grain size of the grain G1 is less than the thickness of the tungsten film WF. This means that the grain G1 configuring the bottom surface of the tungsten film WF and the top surface of this tungsten film WF have therebetween another grain G1. On the contrary, the grain G1 configuring the top surface of the tungsten film WF and the bottom surface of the tungsten film WF have therebetween another grain G1. In addition, separated from the top surface and the bottom surface of the tungsten film WF, the tungsten film WF has a grain G1 formed therein.

The MISFET shown in FIG. 1 operates as follows. Under an off-state where no drain voltage is applied to the drain electrode DE, electrons supplied from the source electrode SE drop in the well potential present in a region which is in the vicinity of the interface between the AlGaN layer and the GaN layer and on the side of the GaN layer and there, a high-density electron aggregate (two-dimensional electron gas) is formed. The two-dimensional electron gas can move freely along the hetero-interface between the AlGaN layer and the GaN layer, forming a channel which is a pathway of electrons in the well potential.

When a predetermined potential is applied to the gate electrode GE under this state and a drain voltage is applied, the two-dimensional electron gas carries electrons from a negative electrode (source electrode SE) toward a positive electrode (drain electrode DE) while retaining high electron mobility and high electron concentration. An electric current therefore flows between source and drain. The two-dimensional electron gas is generated at the interface between the AlGaN layer and the GaN layer by the polarization effect. By enhancing the polarization effect, the concentration of the two-dimensional electron gas increases. This enables operation of the MISFET at higher speeds. The polarization effect is enhanced, for example, by applying a stress so as to compress a channel portion in a C-axis direction. The term "C-axis" means a vertical direction axis in FIG. 1. In other words, the C-axis is an axis along the depth direction in FIG. 1.

The present embodiment is mainly characterized in that the grain size of the grains G1 of the tungsten film WF is 5 nm or less and is less than that of the grains G2 of the barrier metal film BM. The semiconductor device of the present embodiment is also characterized in that the tungsten film WF has no tensile stress because the tungsten film WF has a small grain size; and that since the tungsten film WF has no tensile stress, the interstitial distance (C axis) of AlGaN configuring the barrier layer BA is 1.2938 Å or less. The term "interstitial distance" as used herein means a distance between lattices in the C axis which is a main crystal axis.

Figure 3:
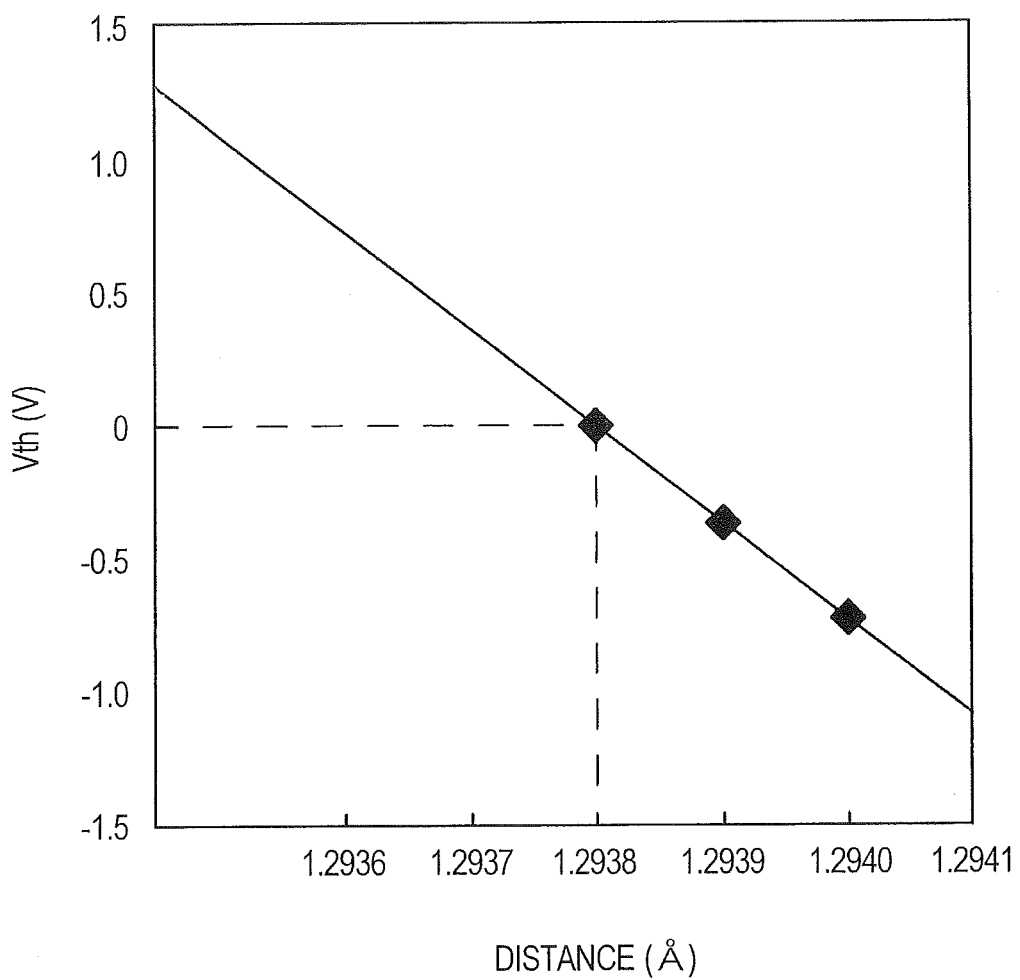
FIG. 3 is a graph showing the relationship between the stress of a tungsten film configuring a gate electrode and the interstitial distance of AlGaN.
Figure 18:
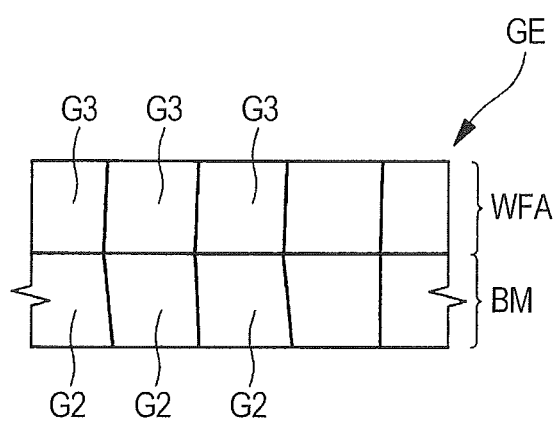
FIG. 18 is a cross-sectional view showing a semiconductor device of Comparative Example.

Advantages of the semiconductor device of the present embodiment will hereinafter be described referring to FIGS. 3 and 18. FIG. 3 is a graph showing the relationship between a stress of the tungsten film configuring the gate electrode and an interstitial distance of AlGaN. FIG. 18 is a cross-sectional view showing a gate electrode of a semiconductor device of Comparative Example.

A GaN power device using GaN, which is a nitride semiconductor, for a pathway through which an electric current flows has a large insulation breakdown field and therefore, can have an improved breakdown voltage compared with an element formed on a silicon (Si) substrate. This facilitates downsizing of the GaN power device. In addition, the GaN power device can be operated at high speeds because it has low ON resistance and high saturation electron velocity. This means that using a MISFET (power transistor) which is a GaN power device can achieve high-speed switching operation.

The MISFET described here has a lateral structure in which all the electrodes of the source, gate, and drain are present on the same plane because a two-dimensional electron gas present at the interface between the AlGaN layer and the GaN layer is used as a pathway of an electric current.

When tungsten (W) having resistance lower than that of silicon (Si) is used as a material of the gate electrode of MISFET, the resulting GaN power device can have enhanced high-speed operation performance due to reduction in the resistance of the gate electrode. In other words, using a stacked structure comprised of a tungsten film and a barrier metal film (for example, TiN film) for a gate electrode can enhance the polarization effect and thereby increase the two-dimensional electron gas concentration. This enables the resulting element to operate at increased speeds. In addition, the tungsten film has another advantage that it can be processed (patterned) easily with good precision.

When the tungsten film to be formed, for example, by sputtering is formed under a relatively high DC power condition, however, it becomes a film having a tensile stress due to an increase in the grain size of the grains. Such a tungsten film having a tensile stress and formed, as a gate insulating film, on a substrate lifts up the end portions of the substrate compared with the center portion of the substrate.

Thus, a stress is applied to the substrate so as to convert it into a bowl-like shape. This corresponds to an increase in interstitial distance in the C-axis direction. In this case, piezo polarization charges peculiar to a nitride semiconductor accumulate in the interface between the AlGaN layer and the GaN layer due to the above-described stress and the resulting MISFET fail to have desired transistor characteristics.

Described specifically, piezo polarization charges reduce the threshold voltage of a MISFET and as a result, the MISFET becomes a normally-on element. Compared with a normally-off MISFET, a normally-on MISFET has difficulty in switching between ON-state and OFF-state so that it does not satisfy characteristics necessary for a switching element. In short, a normally-on MISFET has difficulty in control between ON and OFF so that such a MISFET is not suited for use.

A normally-off MISFET cannot therefore be obtained by using, for a gate electrode, a tungsten film having a large tensile stress. In this case, since it is not possible to make use of the advantage of using a low-resistance tungsten film for a gate electrode, a GaN power device loses its merit, that is, high-speed operability. In short, the semiconductor device thus obtained has deteriorated performance.

In addition, when a tungsten film having a tensile stress is formed on a substrate as a gate insulating film, a defect level occurs at the interface between the substrate and the gate insulating film provided between the gate electrode and the substrate and carriers such as electrons or holes are trapped in the defect level. This means that a trap level occurs at the interface between the gate insulating film and the substrate. In this case, carriers are trapped in the trap level and charges are therefore accumulated in the interface between the gate insulating film and the substrate, causing variations in the threshold voltage of the MISFET. As a result, the semiconductor device thus manufactured has deteriorated reliability.

The present inventors therefore tested a normally-on MISFET equipped with a gate electrode including a tungsten film having a tensile stress. As a result, they have found that grains configuring the tungsten film having a tensile stress have a large grain size; and that the interstitial distance, in the C-axis direction, of the AlGaN layer (barrier layer) of the normally-on MISFET is larger than a predetermined value.

As shown in FIG. 18 as Comparative Example, a tungsten film WFA configuring a gate electrode GE has a plurality of grains G3 and the grains G3 each has a relatively large grain size. The grains G3 are, for example, columnar crystal grains extending in the thickness direction of the tungsten film WFA and they have a grain size more than 5 nm. When the grains G3 have a particularly large grain size, one of the grains G3 extends from the bottom surface to the top surface of the tungsten film WFA.

Such grains G3 are presumed to be formed, influenced by the grain size of the grains G2 configuring the barrier metal film BM. The grain size of the grains G3 may be equal to that of the grains G2 or the grain size of the grains G3 may be more than that of the grains G2. When the tungsten film WFA is formed so as to be contiguous to the top surface of the barrier metal BM, the grains G3 of the tungsten film WFA are likely to have an increased grain size so that the tungsten film WFA tends to have a large tensile strength.

The present inventors have also found based on a test using XRD (X-ray diffraction) that the interstitial distance, in the C-axis direction, of the AlGaN layer (barrier layer) of a normally-on MISFET equipped with a gate electrode including a tungsten film having a tensile stress is more than 1.2938 Å. FIG. 3 shows the relationship between a threshold voltage and an interstitial distance measured by the present inventors. In the graph in FIG. 3, the interstitial distance of the AlGaN layer (barrier layer) is plotted along the abscissa, while the threshold voltage of the MISFET is plotted along the ordinate of the graph.

As shown in FIG. 3, in a normally-on MISFET, that is, a MISFET having a threshold voltage less than 0 V, the more the interstitial distance of the AlGaN layer, the more the threshold voltage in a negative direction. The interstitial distance of the AlGaN layer at a threshold voltage of 0 V which is a boundary value at which a MISFET becomes a normally-on type or a normally-off type is 1.2938 Å. This suggests that the interstitial distance of the AlGaN layer of a normally-on MISFET is more than 1.2938 Å.

As described above, correlation between an increase in interstitial distance and a reduction in threshold voltage occurs as follows. The interstitial distance of an AlGaN layer increases with an increase in tensile stress of a tungsten film configuring a gate electrode of a MISFET and with an increase in the tensile stress, the number of piezo polarization charges increases and the threshold voltage of the MISFET decreases. Thus, the interstitial distance of the AlGaN layer varies, depending on the stress of the tungsten film.

The present inventors have studied, based on the above test results, the realization of a normally-off MISFET by forming, as a low-resistance conductive film to be used for a gate electrode, a tungsten film having no tensile stress. In the present embodiment, therefore, a tungsten film WF having grains G1 with a grain size of 5 nm or less as shown in FIG. 2 is formed as a portion of the gate electrode GE to adjust the stress in the tungsten film WF to 0 MPa or a compression stress. In addition, a normally-off MISFET having a threshold voltage of 0 V or more is obtained by forming it as a MISFET whose AlGaN layer has an interstitial distance of 1.2938 Å or less.

Described specifically, a tungsten film WF having a small grain size has a small tensile stress so that generation of piezo polarization charges can be prevented even if it is formed as a film configuring a gate electrode GE. The MISFET including, in the gate electrode GE thereof, a tungsten film WF having a small grain size can have a threshold voltage increased in a positive direction compared with a MISFET using a tungsten film having a tensile stress. In the present embodiment, the above-described advantage can be achieved by forming, as a constituent film of the gate electrode GE, a tungsten film WF made of the grains G1 having a grain size less than that of the grains G2 of the barrier metal film BM. In particular, the grains G1 having a grain size not more than 5 nm can effectively increase the threshold voltage because the tungsten film WF has no tensile stress.

It is possible to know by measuring the interstitial distance of the AlGaN layer configuring the barrier layer BA that the stress of the tungsten film WF shown in FIG. 1 becomes 0 or a compression stress, for example, by employing the structure as described above. This means that when a MISFET is not a normally-on type, that is, the threshold voltage of the MISFET is a positive value not less than 0 V, the interstitial distance of the AlGaN layer is 1.2938 Å or more as shown in FIG. 3. A normally-off MISFET can therefore be obtained by forming, as the tungsten film WF configuring a part or whole of the gate electrode GE, a tungsten film having such a stress to adjust the interstitial distance of the AlGaN layer configuring the barrier layer BA to 1.2938 Å or more.

Thus, a normally-off MISFET, which is a GaN power device equipped with a gate electrode GE including the low-resistance tungsten film WF, can be obtained while preventing generation of piezo polarization charges. This means that the resistance of the gate electrode GE of a MISFET which is a normally-off type and therefore has good controllability can be reduced so that a MISFET that can be operated at higher speeds can be achieved. The semiconductor device can therefore have improved performance.

In addition, by using the tungsten film WF, which configures the gate electrode GE, having a stress of 0 or a compression stress, generation of a trap level at the interface between a substrate and a gate insulating film provided between the gate electrode and the substrate can be prevented. This makes it possible to prevent variations in threshold voltage of the MISFET. As a result, the semiconductor device can have improved reliability.

[Description of Manufacturing Method]

Next, a method of manufacturing the semiconductor device of the present embodiment will be described referring to FIGS. 4 to 14. FIGS. 4 to 7 and FIGS. 9 to 14 are cross-sectional views showing the method of manufacturing the semiconductor device of the present embodiment. FIG. 8 is a cross-sectional view of a sputtering apparatus to be used in the manufacturing step of the semiconductor device of the present embodiment.

Figure 4:
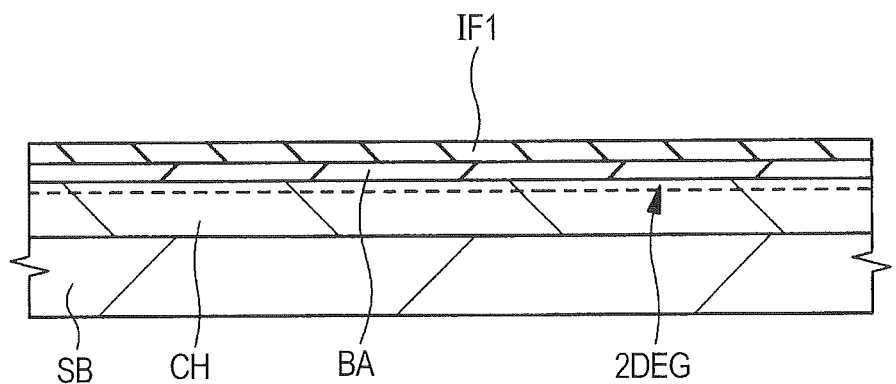
FIG. 4 is a cross-sectional view showing a method of manufacturing the semiconductor device according to First Embodiment of the invention.

As shown in FIG. 4, a substrate SB is provided and a channel layer CH is formed on the substrate SB. As the substrate, for example, a semiconductor substrate made of silicon (Si) having an exposed (111) surface and having a resistivity of 1 Ω·cm is used. As the channel layer CH, a gallium nitride (GaN) layer is hetero-epitaxially grown on the substrate by metal organic chemical vapor deposition (MOCVD) or the like. The channel layer CH thus formed has a thickness of, for example, about 1 μm.

Next, as the barrier layer BA, for example, an AlGaN ($Al_xGa_{(1-x)}N$) layer is hetero-epitaxially grown on the channel layer CH by metal organic chemical vapor deposition or the like. The AlGaN layer has a film thickness of, for example, about 0.03 μm.

In such a manner, a stacked layer of the channel layer CH and the barrier layer BA is formed. This stacked layer is formed by the above-described hetero-epitaxial growth, that is, plane growth of Group III in which they are stacked in the [0001] crystal axis (C-axis) direction. In other words, the above-described stacked layer is formed by (0001) Ga-plane growth. A two-dimensional electron gas 2DEG is formed in the vicinity of the interface of this stacked layer between the channel layer CH and the barrier layer BA.

Next, an insulating film IF1 is formed on the barrier layer BA. As the insulating film IF1, for example, a silicon nitride film ($Si_3N_4$ film, silicon-nitride-containing film) is deposited on the barrier layer BA by CVD (chemical vapor deposition) or the like.

Next, although not illustrated, a photoresist film for opening an element isolation region is formed on the insulating film IF1 by photolithography. With the resulting photoresist film as a mask, boron (B) or nitrogen (N) is then implanted. The boron (B) or nitrogen (N) is injected into the channel layer CH and the barrier layer BA via the insulating film IF1. Implantation of ion species such as boron (B) or nitrogen (N) into the channel layer CH and the barrier layer BA changes the crystal state and increases resistance. In such a manner, an element isolation region is formed. The photoresist film is thereafter removed. A region surrounded by this element isolation region becomes an active region.

Figure 5:
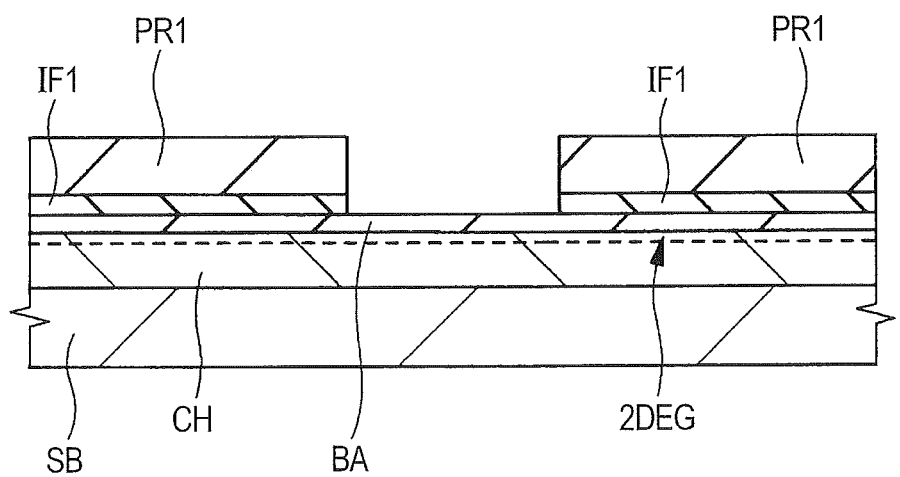
FIG. 5 is a cross-sectional view showing the method of manufacturing the semiconductor device following FIG. 4.

Next, as shown in FIG. 5, a photoresist film PR1 having an opening portion in the active region is formed on the insulating film IF1 by photolithography. Next, with the photoresist film PR1 as a mask, the insulating film IF1 is etched. Processing of a material of an underlying layer into a desired shape by etching while using, as a mask, a photoresist film or a hard mask film processed into a desired shape by photolithography (exposure, development) is called patterning. As an etching gas for the silicon nitride film and the silicon oxide film, for example, a gas such as $CF_4$ or $CHF_3$ can be used. Thus, the insulating film IF1 having an opening portion is formed on the barrier layer BA. In other words, the upper surface of the barrier layer BA is exposed from the bottom of the opening portion of the insulating film IF1.

Figure 6:
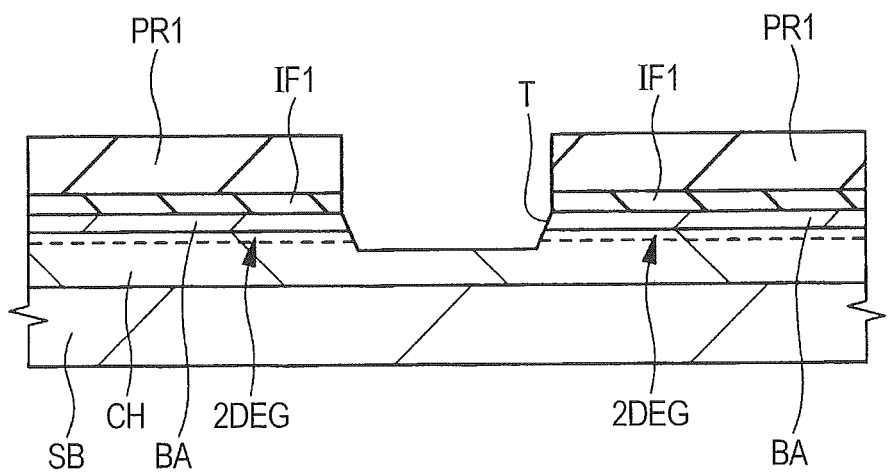
FIG. 6 is a cross-sectional view showing the method of manufacturing the semiconductor device following FIG. 5.

Next, as shown in FIG. 6, with the photoresist film PR1 as a mask, the barrier layer BA and the channel layer CH are etched to form a trench T penetrating the insulating film IF1 and the barrier layer BA and reaching the middle of the channel layer CH. As an etching gas, for example, a halogen-based gas ($Cl_2$, HBr, $BCl_3$ or the like) is used and dry etching is performed in a plasma atmosphere. As a plasma source, for example, ICP (inductive coupling plasma) can be used. By this etching, the barrier layer BA and the surface portion of the channel layer CH below the opening portion is removed and the channel layer CH is exposed from the bottom of the opening portion.

Figure 7:
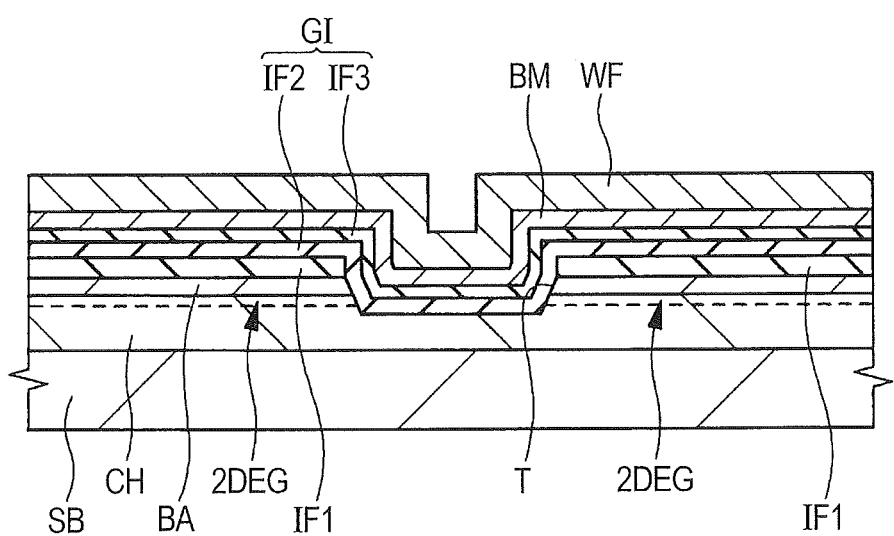
FIG. 7 is a cross-sectional view showing the method of manufacturing the semiconductor device following FIG. 6.
Figure 8:
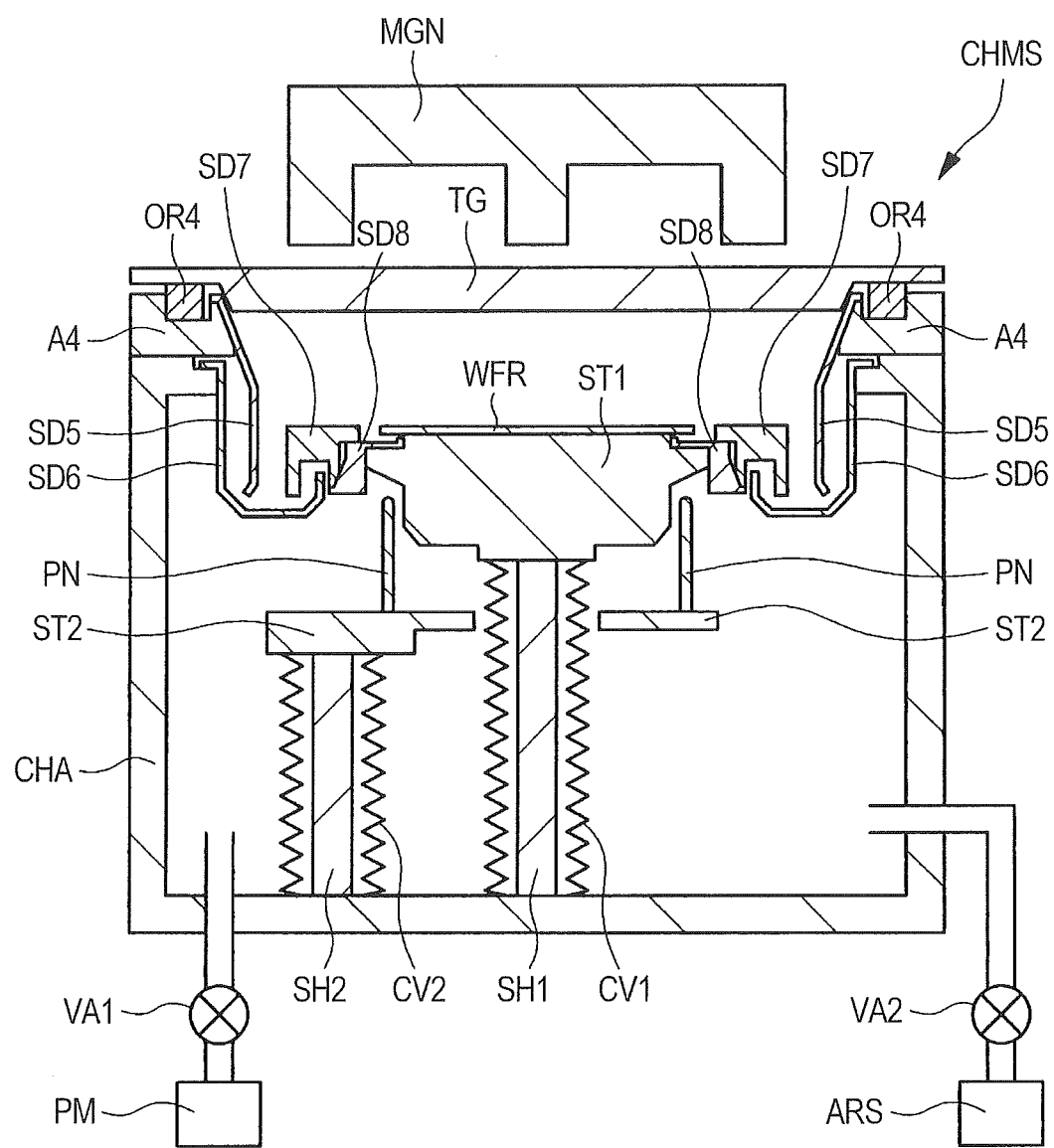
FIG. 8 is a cross-sectional view of a sputtering apparatus to be used in a manufacturing step of the semiconductor device according to First Embodiment of the invention.

Next, as shown in FIG. 7, the photoresist film PR1 is removed. Then, an insulating film that will configure a gate insulating film GI is formed in the trench T and on the insulating film IF1. Here, the insulating film is formed from a stacked film comprised of an insulating film IF2 and an insulating film IF3 stacked on the insulating film IF2. As the insulating film IF2, an aluminum oxide (alumina, $Al_2O_3$) film having a thickness of about 0.1 μm is deposited in the trench and on the insulating film IF1 by ALD (atomic layer deposition) or the like method. As the insulating film IF3, a hafnium oxide film ($HfO_2$ film), which is a high dielectric constant film having a dielectric constant higher than that of a silicon oxide film, is formed on the insulating film IF2 by ALD or the like method.

As the gate insulating film GI, only either one of the insulating film IF2 or IF3 may be formed instead of the above-described stacked structure. As the insulating film IF2, not only an aluminum oxide film but also a silicon oxide film may be used. As the insulating film IF3, not only a hafnium oxide film ($HfO_2$ film) but also another hafnium-based insulating film such as hafnium aluminate film, HfON film (hafnium oxynitride film), HfSiO film (hafnium silicate film), HfSiON film (hafnium silicon oxynitride film), or HfAlO film may be used. Examples of the material of the insulating film IF3 may include zirconium oxide ($ZrO_2$), tantalum oxide ($Ta_2O_5$), and titanium oxide ($TiO_2$).

Next, conductive films which will be a gate electrode GE (refer to FIG. 9) in a later step are formed on the gate insulating film GI. As the conductive films, a barrier metal film BM and a tungsten film WF are formed in order of mention. Described specifically, a stacked film comprised of, for example, a titanium nitride (TiN) film as the barrier metal film BM and the tungsten (W) film WF thereon is deposited using sputtering or CVD on the gate insulating film GI.

The barrier metal film BM is a conductive film provided in order to prevent diffusion of tungsten from the tungsten film WF and improve the adhesion between the tungsten film WF and the gate insulating film GI. As a material of the barrier metal film BM, not only titanium nitride but also titanium (Ti), tantalum (Ta), or tantalum nitride (TaN) may be used. In other words, as the material of the barrier metal film BM, titanium (Ti) or tantalum (Ta), or a nitride compound thereof may be used.

A sputtering apparatus shown in FIG. 8 is used for sputtering to form the barrier metal film BM and the tungsten film WF. As shown in FIG. 8, the sputtering apparatus is equipped with a chamber CHMS. The chamber CHMS has a pump PM which is coupled thereto and discharges a gas from the chamber CHMS to evacuate the chamber CHMS. This means that the chamber CHMS is a vacuum chamber which can be made vacuum. In addition, the chamber CHMS has an argon gas supply source ARS which is coupled thereto and supplies the chamber CHMS with an argon gas (Ar). The chamber CHMS and the pump PM and the chamber CHMS and the argon gas supply source ARS have therebetween valves VA1 and VA2 which open or close pipes, respectively.

The chamber CHMS includes a container CHA having a bottom and a side wall and the container CHA has thereon an annular adapter A4. The adapter A4 has thereon a target TG placed so as to put a lid on an opening portion on the annular adapter A4. For example, a material of the target TG used for forming the barrier metal film BM (refer to FIG. 7) made of, for example, a TiN film is Ti (titanium) and sputtering is performed in a mixed gas atmosphere of argon and nitrogen. A material of the target TG used for forming the tungsten film WF (refer to FIG. 7) is tungsten (W). Since the chamber CHMS is hermetically closed with the container CHA, the adapter A4, and the target TG, the chamber CHMS can be evacuated by discharging a gas from the chamber CHMS by a pump PM with the valve VA1 opened.

The adapter A4 and the target TG have therebetween an annular O ring OR4 and it prevents a gas outside the chamber CHMS from being drawn into the chamber CHMS. The adapter A4 is made of, for example, Al (aluminum) and the o ring OR4 is made of, for example, Cu (copper).

The chamber CHMS has, at the center of the inside thereof, a wafer stage ST1 and the wafer stage ST1 has thereon a semiconductor wafer WFR. Films are to be formed on the semiconductor wafer WFR including the substrate SB shown in FIG. 6. The wafer stage ST1 is supported by a shaft SH1 placed therebelow. The wafer stage ST1 has a hole portion penetrating the top surface to the bottom surface of the stage and the hole portion has a perpendicularly movable pin PN just below the hole portion.

The pin PN is fixed to the upper surface of a stand ST2 and the stand ST2 is supported by a shaft SH2 placed therebelow. During carrying the semiconductor wafer WFR, the pin PN moves upward together with the stand ST2, protrudes over the upper surface of the wafer stage ST1, and serves to lift up the semiconductor wafer WFR. The shaft SH1 is covered, at the periphery thereof, with a bellows-shaped cover CV1 and similarly, the shaft SH2 is covered with a cover CV2. From this drawing, a hole portion which is opened in the wafer stage ST1 and through which the pin PN passes in order to lift up the semiconductor wafer WFR is omitted.

In a sputtering step, an argon gas (Ar) supplied from the argon gas supply source ARS is ionized and bombarded on the target TG. Atoms configuring the target TG are thereby sputtered and a target material thus sputtered is deposited on the upper surface of the semiconductor wafer WFR placed to face the target TG. Here, an argon gas is used as a gas supplied to the sputtering apparatus, but not only argon (Ar) but also Xe (xenon) may be used.

Described specifically, first, the chamber CHMS highly evacuated using the pump PM is introduced with an argon gas (Ar) from the argon gas supply source AR. Next, the argon gas is ionized into an argon ion (Ar$^+$) by making use of glow discharge by a high electric field applied between the target TG and the semiconductor wafer WFR.

Here, a magnetic field is created using a magnet MGN placed on the target TG. Further, a direct current power (DC power) is applied to the target TG. Ion atoms of Ar (argon) are bombarded on the bottom surface of the target TG. Secondary electrons thus emitted are trapped by the Lorentz force and cyclotron motion accelerates the ionization of an inert gas. Such magnetron sputtering is used, which is a method of trapping negative ions and secondary electrons by the magnetic field of the magnet MGN to suppress an increase in the temperature of the target TG and the semiconductor wafer WFR, accelerating ionization of a gas by the electrons thus trapped, and increasing a film forming speed.

When the direct current voltage is applied to the target TG for generating the high electric field in order to form the barrier metal film BM (refer to FIG. 7), the direct current voltage is applied, for example, at a power of 1 kW. On the other hand, when the direct current voltage is applied to the target TG for generating the high electric field in order to form the tungsten film WF (refer to FIG. 7), the direct current voltage is applied, for example, at a power of 300 W or less. In short, the DC power for sputtering to form the barrier metal film BM is more than 300 W, while the DC power for sputtering to form the tungsten film WF is 300 W or less.

When argon ions are accelerated by the high electric field to bombard the target TG therewith, a portion of the atoms of the target material emitted by the rebound attaches to the main surface of the semiconductor wafer WFR. A film made of the material attached to the main surface of the semiconductor wafer WFR, that is, a sputter film is thus formed. The term "sputter film" as used herein means a film formed by sputtering. More specifically, it is a film formed as a result of attachment of a component emitted from the target TG by sputtering and bombarding.

By the above-described sputtering step, a component emitted from the target TG is caused to adhere to the upper surface of the semiconductor wafer WFR and thus, the barrier metal film BM and the tungsten film WF shown in FIG. 7 are formed.

The wafer stage ST1 shown in FIG. 8 has, in the horizontal direction thereof, annular shields SD5, SD6, SD7, and SD8 each having, in plan view, a round shape and surrounding the wafer stage ST1. The shield SD8 is adjacent to the side wall of the wafer stage ST1 and it has outside thereof the shield SD7. Thus, a region between the target TG and the wafer stage ST1 is, at the periphery thereof, surrounded with the shields SD5 to SD8. The shield SD5 is supported by the adapter A4.

The tungsten film WF can have a reduced grain size as shown in FIG. 2 by performing the above-described sputtering for forming the tungsten film WF while setting the DC power condition to a relatively low value not more than 300 W. This means that the grain size of the grains G1 configuring the tungsten film WF can be reduced to, for example, 5 nm. The barrier metal film BM is, on the other hand, formed under a high DC power condition (for example, 1 kW or more) so that the grain size of the grains G2 configuring the barrier metal film BM becomes more than that of the grains G1.

Figure 9:
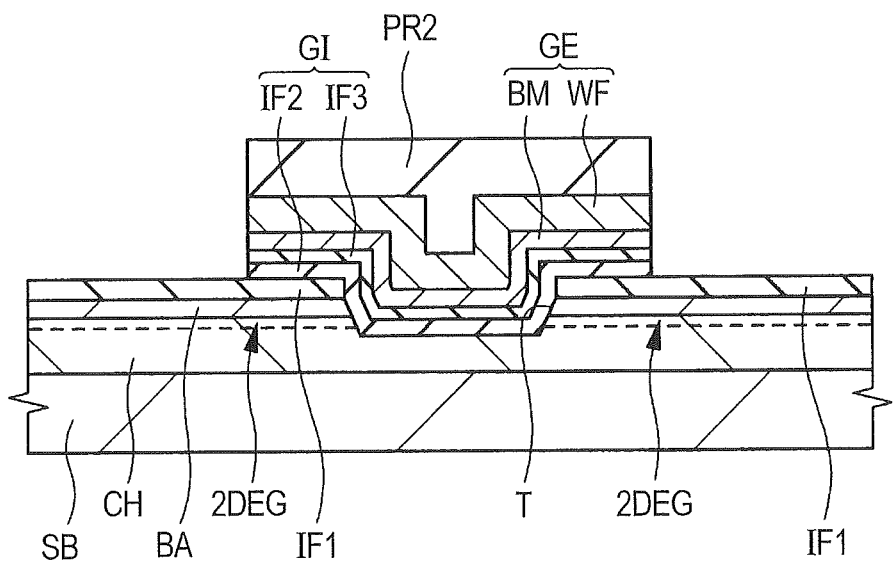
FIG. 9 is a cross-sectional view describing a manufacturing step of the semiconductor device following that of FIG. 7.

Next, as shown in FIG. 9, the tungsten film WF, the barrier metal film BM, and the insulating films IF3 and IF2 are patterned using photolithography and etching. Here, by patterning the tungsten film WF and the barrier metal film BM, a gate electrode GE having a stacked structure comprised of the pattern of the tungsten film WF and the pattern of the barrier metal film BM is formed. In addition, by patterning the insulating films IF3 and IF2, a gate insulating film GI having a stacked structure comprised of the pattern of the insulating film IF3 and the pattern of the insulating film IF2 is formed.

Described specifically, a photoresist film PR2 that covers the formation region of the gate electrode GE is formed using photolithography and with the resulting photoresist film PR2 as a mask, the tungsten film WF, the barrier metal film BM, and the insulating films IF3 and IF2 are etched. As an etching gas, for example, a halogen-based gas ($Cl_2$ or HBr, or a mixed gas of them) is used and dry etching is performed in a plasma atmosphere. As a plasma source, for example, ICP (inductively coupled plasma) or the like can be used. During this etching, the insulating film IF1 serves as an etching stopper.

The insulating films IF2 and IF3, the barrier metal film BM, and the tungsten film WF right above the trench T and in the vicinity of the trench T are left without being removed. By this etching to remove the insulating films IF2 and IF3, the barrier metal film BM, and the tungsten film WF from regions separated from the trench T and on both sides sandwiching the trench T in a direction along the main surface of the substrate SB, the upper surface of the insulating film IF1 is exposed.

Figure 10:
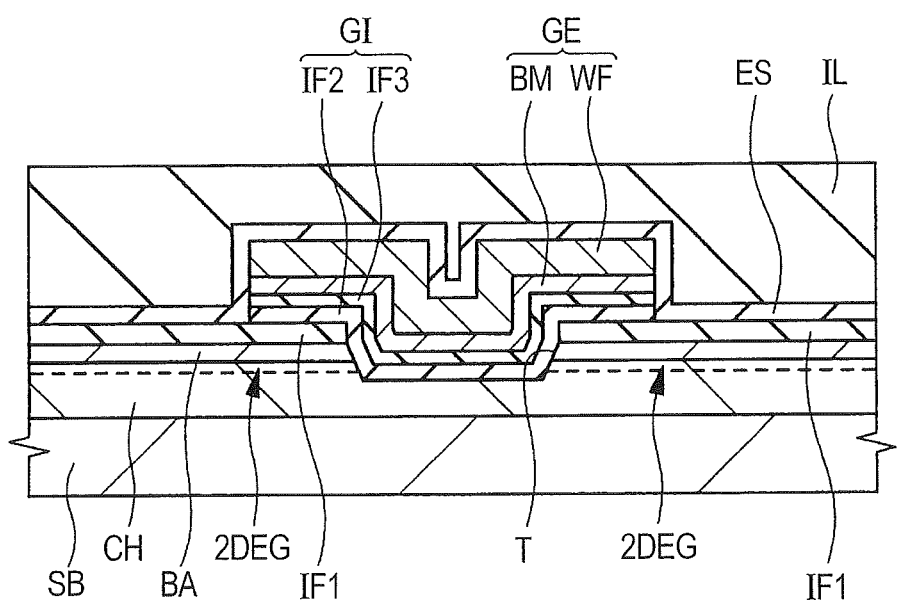
FIG. 10 is a cross-sectional view describing a manufacturing step of the semiconductor device following that of FIG. 9.

Next, as shown in FIG. 10, after removal of the photoresist film PR2, interlayer insulating films ES and IL are formed successively on the gate electrode GE. Described specifically, for example, a silicon nitride film is deposited using CVD or the like as the interlayer insulating film ES on the gate electrode GE and the insulating film IF1. Then, for example, a silicon oxide film is deposited using CVD or the like as the interlayer insulating film IL. The upper surface of the interlayer insulating film IL is then planarized using CMP (chemical mechanical polishing) or the like.

Figure 11:
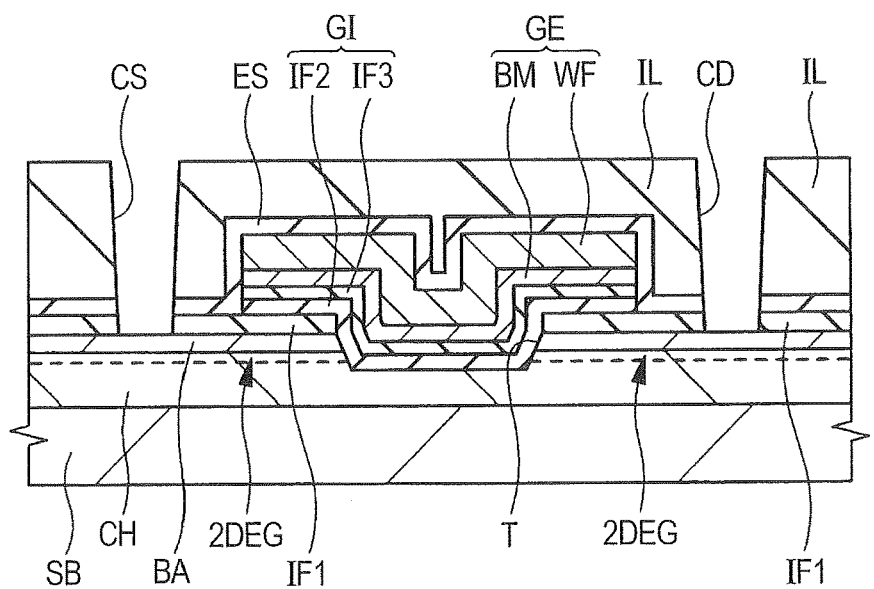
FIG. 11 is a cross-sectional view describing a manufacturing step of the semiconductor device following that of FIG. 10.

Next, as shown in FIG. 11, contact holes CS and CD each penetrating the interlayer insulating films IL and ES are formed using photolithography and etching. For example, with a photoresist film not shown in the drawing as a mask, the contact hole CS is formed by etching the interlayer insulating films IL and ES in a source electrode formation region and the contact hole CD is formed by etching the interlayer insulating films IL and ES in a drain electrode formation region. The insulating film IF1 lying below the interlayer insulating film IL is also removed by this etching.

As a result, the upper surface of the barrier layer BA is exposed from the bottom of the contact hole CS and the contact hole CD. Thus, the contact hole CS and the contact hole CD are placed on the barrier layer BA on both sides of the gate electrode GE, respectively. A contact hole (not shown) is formed also on the gate electrode GE during formation of the contact hole CS and the contact hole CD.

Figure 12:
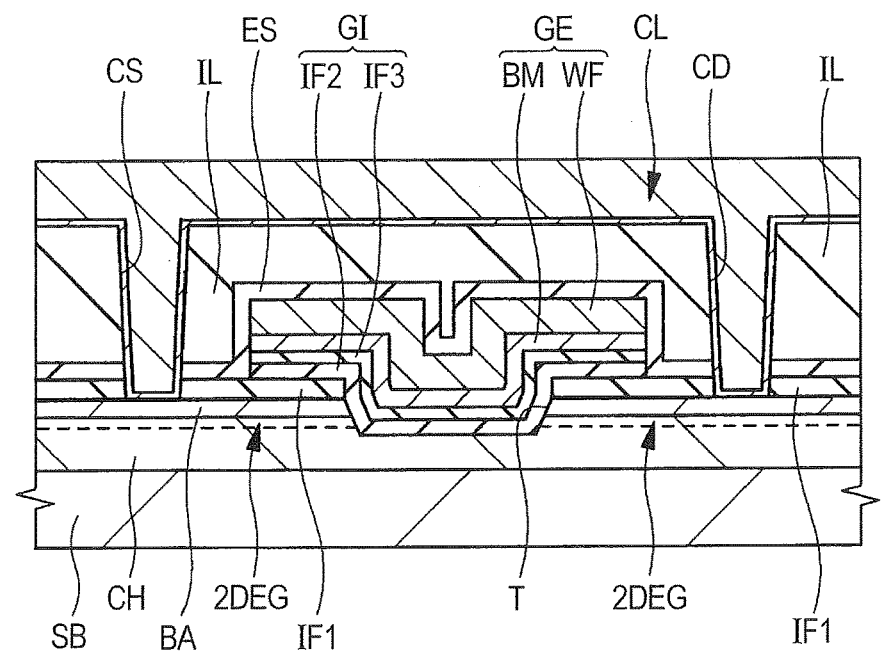
FIG. 12 is a cross-sectional view describing a manufacturing step of the semiconductor device following that of FIG. 11.

Next, as shown in FIG. 12, a conductive film CL is formed on the interlayer insulating film IL and also in the contact holes CS and CD. First, an ohmic layer is formed on the interlayer insulating film IL and also in the contact holes CS and CD. For example, a titanium (Ti) film of about 0.05 μm thick is deposited on the interlayer insulating film IL and in the contact holes CS and CD by sputtering or the like. Next, an aluminum film of about 0.6 μm thick is deposited, as a metal film, on the ohmic layer by sputtering or the like. The conductive film CL is comprised of the ohmic layer and the metal film thus formed.

The sputtering for the formation of the conductive film CL is performed using the sputtering apparatus described referring to FIG. 8. The material of the target TG used for this sputtering is changed as needed, depending on the material of a sputter film to be formed. The DC power for this sputtering is set at, for example, about 3 kW or 5 kW.

Next, heat treatment is performed to reduce the coupling resistance between the barrier layer BA and the ohmic layer. For example, heat treatment is performed at 650° C. for about 30 seconds in a nitrogen atmosphere. As the metal film, not only aluminum but also an aluminum alloy may be used. Examples of the aluminum alloy include an alloy (Al—Si) between Al and Si, an alloy (Al—Cu) between Al and Cu (copper), and an alloy (Al—Si—Cu) among Al, Si, and Cu.

Figure 13:
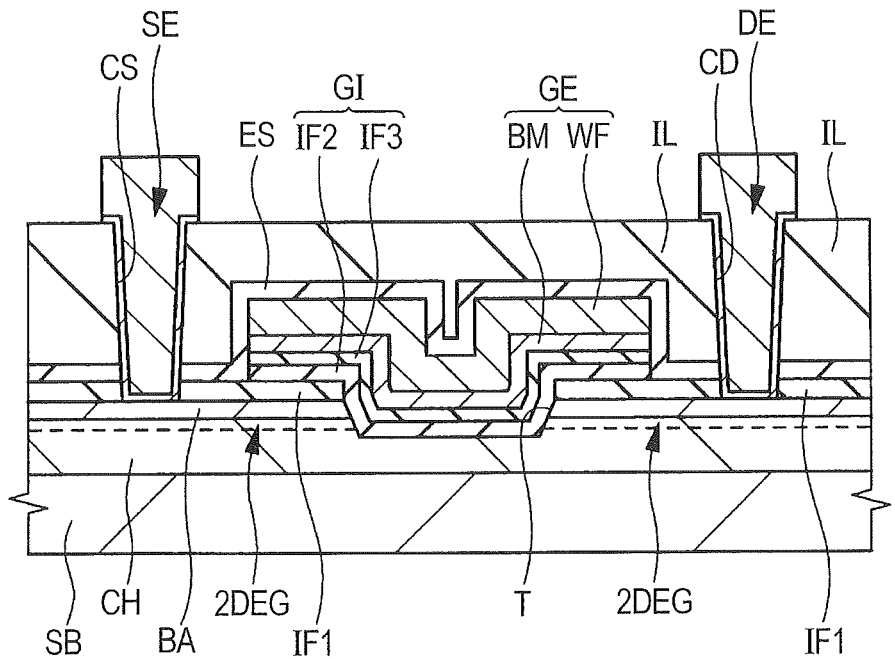
FIG. 13 is a cross-sectional view describing a manufacturing step of the semiconductor device following that of FIG. 12.

Next, as shown in FIG. 13, the conductive film CL made of a Ti/Al film is patterned using photolithography and etching. By this patterning, a source electrode SE and a drain electrode DE, respective portions of which have filled the contact holes CS and CD, are formed, respectively. The other portion of each of the source electrode SE and the drain electrode DE is formed as a wiring portion on the interlayer insulating film IL. As a result, a MISFET including the gate electrode GE, the source electrode SE, the drain electrode DE, and the channel layer CH is formed.

The source electrode SE is comprised of a coupling portion (plug) located in the contact hole CS penetrating the interlayer insulating films ES and IL and a wiring portion on this coupling portion. The drain electrode DE is comprised of a coupling portion (plug) located in the contact hole CD penetrating the the interlayer insulating films ES and IL and a wiring portion on this coupling portion. In a region not shown in this drawing, a gate wiring comprised of a coupling portion (plug) embedded in a contact hole and a wiring portion on this coupling portion is formed also on the gate electrode GE.

Figure 14:
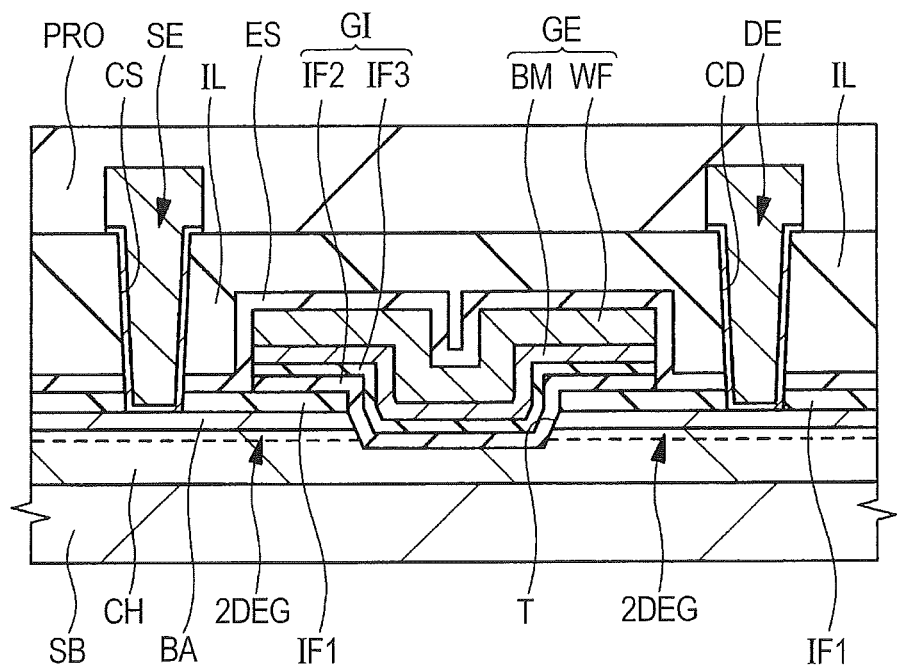
FIG. 14 is a cross-sectional view describing a manufacturing step of the semiconductor device following that of FIG. 13.

Next, as shown in FIG. 14, a protective insulating film PRO is formed on the interlayer insulating film IL and also on the source electrode SE and the drain electrode DE. As the protective film PRO, for example, a silicon oxynitride (SiON) film is deposited by CVD or the like on the interlayer insulating film IL and also on the source electrode SE and the drain electrode DE.

By the above-described steps, a semiconductor device including an MISFET, which is a power transistor, can be formed. The above-described steps are shown only as an example and the semiconductor device of the present embodiment may be manufactured by steps other than the above-described ones.

Figure 15:
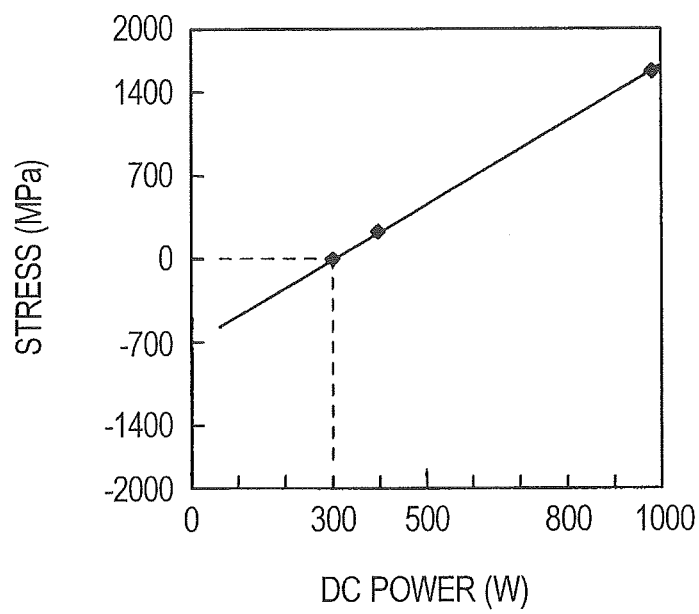
FIG. 15 is a graph showing the relationship between the DC power upon sputtering for forming a tungsten film and the stress in the tungsten film formed by sputtering.

An advantage of the method of manufacturing a semiconductor device according to the present embodiment will hereinafter be described referring to FIG. 15 and the like. FIG. 15 is a graph showing the relationship between the DC power of sputtering during formation of a tungsten film and a stress in the tungsten film formed by sputtering. The DC power of sputtering during formation of a tungsten film is plotted along the abscissa of FIG. 15, while the stress in the tungsten film formed by the sputtering is plotted along the ordinate of FIG. 15. Positive stress values show a tensile stress and negative stress values show a compression stress.

As described above with respect to the advantage of the semiconductor device, when a tungsten film is used as a constituent film of a gate electrode in order to enhance the high-speed operation performance of a MISFET (power transistor) which is a GaN power device, piezo polarization charges are generated due to the tensile stress of the tungsten film and therefore, the MISFET thus obtained becomes a normally-on type undesirably. The reason why the tungsten film having a tensile stress is formed is because sputtering for the formation of the tungsten film in the manufacturing steps of the semiconductor device is performed under a relatively high DC power condition.

FIG. 15 is a graph showing, as measurement results by the present inventors, the relationship between the DC power and the stress in the tungsten film. As can be seen from FIG. 15, the more the power (DC power) applied to the target TG (refer to FIG. 8) in the sputtering step, the more the positive-direction stress in the tungsten film formed by the sputtering step. This results from that the more the DC power for sputtering, the more the grain size of the grains configuring the tungsten film formed by sputtering.

Described specifically, when a tungsten film is formed by performing a sputtering step, for example, at a DC power of 1 kW, grains G3 configuring a tungsten film WFA have a relatively large grain size, as shown as Comparative Example in FIG. 18.

On the other hand, as shown in FIG. 15, the less the power (DC power) to be applied to the target TG (refer to FIG. 8) in the sputtering step, the more the negative-direction stress in the tungsten film formed by this sputtering step. When the DC power is decreased continuously and it becomes 300 W, the stress in the tungsten film thereafter becomes a compression stress. This means that a tungsten film having no tensile stress can be formed under a DC power condition reduced to 300 W or less.

In the present embodiment, therefore, during sputtering for the formation of the tungsten film WF (refer to FIG. 7) configuring the gate electrode GE (refer to FIG. 14), a tungsten film having no tensile stress is formed as the tungsten film WF by adjusting the DC power condition of sputtering at 300 W or less. As shown in FIG. 2, this makes it possible to form the tungsten film WF having grains G1 with a small grain size and having an internal stress of 0 or a compression stress. In particular, if a tungsten film having grains G1 with a grain size of 5 nm or less can be formed as the tungsten film WF by setting at DC energy at 300 W or less, the stress of the gate electrode GE becomes a compression stress so that generation of piezo polarization charges can be prevented effectively.

In addition, when the DC power condition is reduced to form the tungsten film WF having no tensile stress, the interstitial distance of the AlGaN layer (the barrier layer BA shown in FIG. 14) of the MISFET becomes 1.2938 Å or less. As described above referring to FIG. 3, the MISFET thus formed has a threshold voltage of 0 V or more. As a result, a normally-off MISFET can be formed.

This means that in the method of manufacturing a semiconductor device according to the present embodiment, by setting the DC power condition of sputtering for the formation of the tungsten film WF configuring the gate electrode GE at 300 W or less, the tungsten film WF having no stress is formed and generation of piezo polarization charges can therefore be prevented. This can prevent the resulting MISFET from becoming a normally-on type and having difficulty in the ON/OFF control, influenced by piezo polarization charges. In other words, using the low-resistance tungsten film WF as a constituent film of the gate electrode GE enables the resulting MISFET to have improved high-speed operation performance and at the same time, to have improved controllability. As a result, the semiconductor device thus obtained can have improved performance.

In addition, as shown in FIG. 15, by setting the DC power at 300 W or less to provide the tungsten film WF, which configures the gate electrode GE, having a stress of 0 or a compression stress, generation of a trap level at the interface between the substrate and the gate insulating film provided between the gate electrode and the substrate can be prevented. As a result, the resulting MISFET is free from variations in threshold voltage and the semiconductor device thus manufactured can have improved reliability.

Using sputtering for the formation of the tungsten film WF having no tensile stress has been described above. When the tungsten film WF having no tensile stress is formed using CVD, low-temperature and low-pressure conditions may be used for the film formation by CVD. The advantage achieved by this method is then similar to that achieved by sputtering used for the formation of the tungsten film WF having no tensile stress.

Second Embodiment

Figure 16:
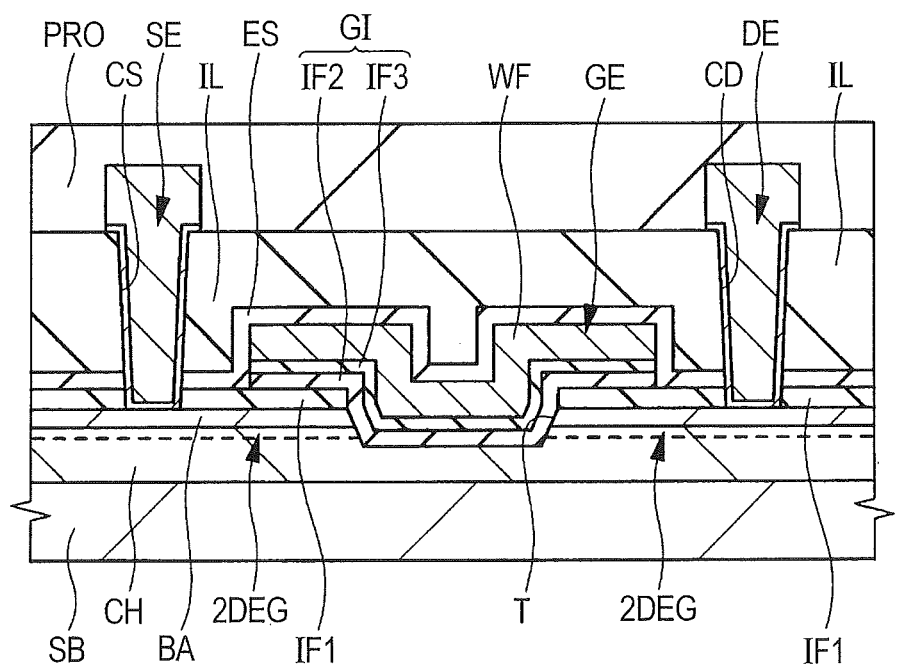
FIG. 16 is a cross-sectional view showing a semiconductor device according to Second Embodiment of the invention.
Figure 17:
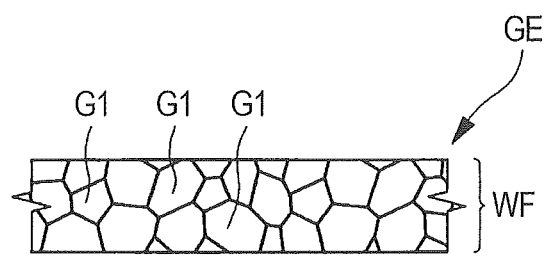
FIG. 17 is a cross-sectional view of the semiconductor device according to Second Embodiment of the invention.

In First Embodiment, the gate electrode comprised of the stacked film of a barrier metal film and a tungsten film has been described. Alternatively, the gate electrode may be comprised only of the tungsten film WF as shown in FIGS. 16 and 17. FIG. 16 is a cross-sectional view showing a semiconductor device of the present embodiment. FIG. 17 is a cross-sectional view showing the semiconductor device of the present embodiment and is also an enlarged cross-sectional view of a portion of the gate electrode GE shown in FIG. 16. FIG. 17 is a cross-sectional view, but hatching is omitted to facilitate understanding of this drawing.

As shown in FIG. 16, the structure of the semiconductor device of the present embodiment is similar to that of First Embodiment except for the constitution of the gate electrode GE. In this embodiment, the tungsten film WF is on and in contact with the gate insulating film GI and the gate electrode is comprised only of the tungsten film WF.

As shown in FIG. 17, the structure of the tungsten film WF is similar to that of the tungsten film WF described referring to FIG. 2. Described specifically, the grain size of the grains G1 configuring the tungsten film WF is 5 nm or less. The tungsten film WF having no tensile stress can be obtained by forming the tungsten film WF while reducing the grain size of the film.

The semiconductor device of the present embodiment has an advantage similar to that of the semiconductor device of First Embodiment.

Also in the present embodiment, a tungsten film having a small grain size and an internal stress of 0 or a compression stress can be obtained as the tungsten film WF configuring the gate electrode GE by sputtering at a DC power set at 300 W or less. In addition, by providing the tungsten film WF having no tensile stress so as to adjust the interstitial distance of the AlGaN layer (the barrier layer BA shown in FIG. 14) of a MISFET to 1.2938 Å or less, the resulting MISFET can have a threshold voltage of 0 V or more.

A MISFET equipped with the gate electrode GE made of such a tungsten film WF can be used as a normally-off switching element and has good controllability. In addition, due to the gate electrode GE comprised of the tungsten film WF, the MISFET thus obtained can have enhanced high-speed operation performance. Further, since the gate electrode GE having no tensile stress can be formed, variations of a threshold voltage due to generation of a trap level can be prevented.

The invention made by the present inventors has been described in detail based on some embodiments. It is needless to say that the present invention is however not limited to these embodiments, but can be changed in various ways without departing from the gist of the invention.

In addition, some of the details described in the embodiments will next be described.

(1) A semiconductor device includes:
a substrate;
a first nitride semiconductor layer formed on the substrate;
a second nitride semiconductor layer formed on the first nitride semiconductor layer and having a band gap wider than that of the first nitride semiconductor layer;
an insulating film formed on the second nitride semiconductor layer;
a trench penetrating the insulating film and the second nitride semiconductor layer and reaching the middle of the first nitride semiconductor layer; and
a gate electrode formed in the trench and on the insulating film via a gate insulating film, in which
the gate electrode has a tungsten film, and
the second nitride semiconductor layer has an interstitial distance of 1.2938 Å or less.

(2) A method of manufacturing a semiconductor device, includes the steps of:
(a) providing a substrate;
(b) forming a first nitride semiconductor layer on the substrate;
(c) forming, on the first nitride semiconductor layer, a second nitride semiconductor layer having a band gap wider than that of the first nitride semiconductor layer;
(d) forming an insulating film on the second nitride semiconductor layer;
(e) forming a trench penetrating the insulating film and the second nitride semiconductor layer and reaching the middle of the first nitride semiconductor layer;
(f) forming a gate insulating film in the trench and on the insulating film;
(g) forming a conductive film on the gate insulating film by first sputtering; and
(h) forming a tungsten film on the conductive film by second sputtering and thereby forming a gate electrode including the conductive film and the tungsten film,
in which a first DC power to be applied to a second target to be sputtered in the second sputtering is less than a second DC power to be applied to a first target to be sputtered.

What is claimed is:

1. A semiconductor device, comprising:
a substrate;
a first nitride semiconductor layer formed over the substrate;
a second nitride semiconductor layer formed over the first nitride semiconductor layer and having a band gap wider than that of the first nitride semiconductor layer;
an insulating film formed over the second nitride semiconductor layer;
a trench penetrating the insulating film and the second nitride semiconductor layer and reaching the middle of the first nitride semiconductor layer; and
a gate electrode formed in the trench and over the insulating film via a gate insulating film,
wherein the gate electrode has a conductive film and a tungsten film formed over the conductive film, and
wherein first grains configuring the tungsten film have a grain size smaller than that of second grains configuring the conductive film.

2. The semiconductor device according to claim 1,
wherein the first grains have a grain size of 5 nm or less.

3. The semiconductor device according to claim 1,
wherein the second nitride semiconductor layer has an interstitial distance of 1.2938 Å or less.

4. The semiconductor device according to claim 1,
wherein the tungsten film has a plurality of the first grains, and
wherein some of the first grains configure neither the top surface nor the bottom surface of the tungsten film.

5. The semiconductor device according to claim 1, further comprising:
a source electrode formed over the second nitride semiconductor layer and coupled to the top surface of the second nitride semiconductor layer; and
a drain electrode formed over the second nitride semiconductor layer and coupled to the top surface of the second nitride semiconductor layer,
wherein the gate electrode is placed between the source electrode and the drain electrode, and
wherein the gate electrode, the source electrode, and the drain electrode configure a field effect transistor.

6. The semiconductor device according to claim 5,
wherein the field effect transistor has a threshold voltage of 0 V or more.

* * * * *